(12) United States Patent
Wilford et al.

(10) Patent No.: US 6,570,816 B2
(45) Date of Patent: May 27, 2003

(54) CIRCUIT AND METHOD FOR REDUCING MEMORY IDLE CYCLES

(75) Inventors: John R. Wilford, Meridian, ID (US); Joseph T. Pawlowski, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/274,773

(22) Filed: Oct. 21, 2002

(65) Prior Publication Data

US 2003/0035339 A1 Feb. 20, 2003

Related U.S. Application Data

(63) Continuation of application No. 09/642,355, filed on Aug. 21, 2000, now Pat. No. 6,469,954.

(51) Int. Cl.[7] .................................................. G11C 8/00
(52) U.S. Cl. ............. 365/233; 365/230.02; 365/230.03; 365/189.02; 365/189.04; 365/189.05
(58) Field of Search .......................... 365/233, 230.02, 365/230.03, 230.08, 189.04, 189.02, 189.05

(56) References Cited

U.S. PATENT DOCUMENTS

| | | | |
|---|---|---|---|
| 5,594,704 A | * | 1/1997 | Konishi et al. ............. 365/233 |
| 5,598,376 A | | 1/1997 | Merritt et al. |
| 5,729,503 A | | 3/1998 | Manning |
| 5,831,924 A | | 11/1998 | Nitta et al. |
| 5,835,436 A | * | 11/1998 | Ooishi ................... 365/230.03 |
| 5,917,772 A | | 6/1999 | Pawlowski |
| 5,973,989 A | | 10/1999 | Pawlowski |
| 5,978,284 A | | 11/1999 | Pawlowski |
| 5,978,311 A | | 11/1999 | Wilford et al. |
| 6,009,494 A | | 12/1999 | Pawlowski |
| 6,128,244 A | * | 10/2000 | Thompson et al. ..... 365/230.03 |
| 6,134,180 A | | 10/2000 | Kim et al. |
| 6,219,283 B1 | | 4/2001 | Wilford |
| 6,282,135 B1 | * | 8/2001 | Proebsting ................... 365/203 |
| 6,356,485 B1 | * | 3/2002 | Proebsting ............. 365/189.01 |
| 6,381,191 B2 | * | 4/2002 | Ooishi ................... 365/230.03 |

* cited by examiner

*Primary Examiner*—Richard Elms
*Assistant Examiner*—Tuan T. Nguyen
(74) *Attorney, Agent, or Firm*—TraskBritt

(57) ABSTRACT

An N-bit wide synchronous, burst-oriented Static Random Access Memory (SRAM) reads out a full N bits simultaneously from its array in accordance with an address A0 into N latched sense amplifiers, which then sequentially output N/X bit words in X burst cycles. Because the SRAM's array reads out the full N bits simultaneously, the array's address bus is freed up to latch in the next sequential address A1 so data output continues uninterrupted, in contrast to certain conventional SRAMs. The SRAM also writes in a full N bits simultaneously after sequentially latching in N/X bit words in X burst cycles into N write drivers. This simultaneous write frees up the array's address bus to begin latching in the next sequential address A1 so data input continues uninterrupted, again in contrast to certain conventional SRAMs.

11 Claims, 8 Drawing Sheets

CIRCUIT AND METHOD FOR REDUCING MEMORY IDLE CYCLES

CROSS-REFERENCE TO RELATED APPLICATIONS

This application is a continuation of application Ser. No. 09/642,355, filed Aug. 21, 2000, now U.S. Pat. No. 6,469,954, issued Oct. 22, 2002, which application is related to a co-pending patent application filed Sep. 3, 1998, having Ser. No. 09/146,472, and entitled "Memory Device with Local Write Data Latches" and to co-pending patent application filed Mar. 3, 1998, having Ser. No. 09/034,203, and entitled "Memory with Combined Synchronous Burst and Bus Efficient Functionality."

BACKGROUND OF THE INVENTION

1. Field of the Invention

This invention relates in general to semiconductor memory devices and, more specifically, to devices and methods for reducing idle cycles in semiconductor memory devices, such as synchronous Static Random Access Memory (SRAM) devices.

2. Description of the Related Art

Modem synchronous SRAM devices are typically burst-oriented, which means that they perform read or write operations on a sequence of internal addresses in response to receiving a single, externally supplied address. Thus, for example, in a modern 64K×32 SRAM device with a burst length of four, a single, externally-generated address supplied to the device during a read operation causes the device to sequentially output four, 32-bit wide data words. Similarly, a single, externally-generated address supplied to the device during a write operation causes the device to sequentially write in four, 32-bit wide data words. Because internal addresses can be generated within burst-oriented SRAM devices much faster than external addresses can be latched into such devices, read and write operations occur more rapidly in burst-oriented SRAM devices than in older, non-burst-oriented SRAM devices.

Despite the speed boost provided by burst operations, read operations in modern burst-oriented SRAM devices are not as fast as is desirable. For example, as shown in FIG. 1, sequential read operations 10 and 12 (only a portion of read operation 12 is shown in FIG. 1) in a conventional burst-oriented SRAM (not shown) are separated by an idle cycle 14, which adds to the total time it takes to perform the read operations 10 and 12.

More specifically, the first read operation 10 is initiated at time $t_0$ when the address register signal ADSC* is activated, causing the first address A0 to be registered into the SRAM. The registered address A0 is then presented to the memory array (not shown) of the SRAM at time $t_1$, and the data D0 specified by the address A0 is output from the array at time $t_2$ and from the SRAM at time $t_3$. Next, an internally-generated burst address A0+1 is presented to the memory array at time $t_4$, causing the array to output the data D0+1 specified by the address A0+1 at the same time. The data D0+1 is then output from the SRAM at time $t_5$. Thereafter, internally-generated burst addresses A0+2 and A0+3, respectively, are presented to the memory array at times $t_6$ and $t_8$, respectively, causing the array to output the data D0+2 and D0+3 specified by the addresses A0+2 and A0+3, respectively, at the same times. The data D0+2 and D0+3 are then output from the SRAM at times $t_7$ and $t_{10}$, respectively. Before the data D0+3 is output from the SRAM at time $t_{10}$, the address register signal ADSC* is activated again at time $t_9$, causing the second address A1 to be registered into the SRAM at the same time. The read operation 12 then proceeds in the same manner as the read operation 10.

It should be noted that because the address A0+3 is still being presented to the array when the second address A1 is registered at time $t_9$, the idle cycle 14 is necessary to provide sufficient recovery time from the operation performed at A0+3.

Write operations in modern burst-oriented SRAM devices are also not as fast as is desirable. For example, as shown in FIG. 2, sequential write operations 20 and 22 (only a portion of write operation 22 is shown in FIG. 2) in a conventional burst-oriented SRAM (not shown) are separated by a recovery period 24, which adds to the total time it takes to perform the write operations 20 and 22.

More specifically, the first write operation 20 is initiated at time $t_0$ when the address register signal ADSC* is activated, causing the first address A0 to be registered into the SRAM. The registered address A0 is then presented to the memory array (not shown) of the SRAM at time $t_1$, and the first data D0 is registered into the SRAM at time $t_2$. Next, the registered data D0 is written into the array at time $t_3$ at the location specified by the address A0, and the data D0+1 is registered into the SRAM at time $t_4$. Thereafter, internally-generated burst addresses A0+1 and A0+2 are presented to the memory array at times $t_5$ and $t_7$, respectively, the data D0+2 and D0+3 is registered into the SRAM at times $t_6$ and $t_8$, respectively, and the data D0+1 and D0+2 is written into the array at the locations specified by the addresses A0+1 and A0+2, respectively, at times $t_5$ and $t_7$. An internally-generated burst address A0+3 is then presented to the memory array at time $t_9$, causing the data D0+3 to be written into the array at the location specified by the address A0+3 at the same time. Next, the address register signal ADSC* is activated again at time $t_{10}$, causing the second address A1 to be registered into the SRAM. The second write operation 22 then proceeds in the same manner as the first write operation 20 after the recovery period 24 has passed.

Accordingly, because conventional synchronous SRAMs include idle cycles during read and write operations that limit the bandwidth of such SRAMs, there is a need in the art for a device and method that reduces the number of idle cycles necessary in read and write operations of semiconductor memory devices, such as sequential SRAMs, thereby further accelerating read and write operations in such devices.

BRIEF SUMMARY OF THE INVENTION

In one embodiment of this invention, a memory operation (e.g., a read or write operation) is performed in a semiconductor memory (e.g., a synchronous, burst-oriented Static Random Access Memory (SRAM)) by selecting an N-bit wide row of the semiconductor memory. Then, a number (X) of data portions of N/X bits each are simultaneously transferred between the selected row and N-bit wide temporary storage that is in communication with the selected row.

In another embodiment, N data bits are read from a semiconductor memory by first selecting a row of the semiconductor memory in accordance with an externally supplied address. N data bits stored in the selected row are then simultaneously accessed and temporarily stored (e.g., in N latched sense amplifiers). A portion of the temporarily stored N data bits are then selected in accordance with the externally supplied address and read out of the semiconductor memory. Next, one or more internal burst addresses are generated from the externally supplied address and, for each internal burst address generated, another portion of the temporarily stored N data bits is selected in accordance with the internal burst address and read out of the semiconductor memory.

In still another embodiment, N data bits are written into a semiconductor memory. The N data bits are first received in a plurality of sequential portions, and one of the sequential portions of the N data bits is temporarily stored in accordance with an externally supplied address. Also, one or more internal burst addresses are generated from the externally supplied address and, for each internal burst address generated, another one of the sequential portions of the N data bits is temporarily stored in accordance with the internal burst address. A row of the semiconductor memory is then selected in accordance with the externally supplied address, and the temporarily stored sequential portions of the N data bits are simultaneously written into the selected row.

In yet another embodiment of this invention, a burst-oriented SRAM having a burst length of X includes a memory array having a plurality of N-bit wide rows. Storage circuitry temporarily stores N bits, and buffer circuitry buffers X sequential data portions of N/X bits each. Multiplexing circuitry between the storage circuitry and the buffer circuitry sequentially transfers the X sequential data portions between the storage circuitry and the buffer circuitry, and circuitry connected to the storage circuitry directs the storage circuitry to simultaneously transfer N bits between a selected N-bit wide row of the memory array and the storage circuitry.

In an additional embodiment of this invention, a semiconductor memory includes a memory array and storage circuitry that temporarily stores N bits. Buffer circuitry buffers X sequential data portions of N/X bits each, and circuitry connected between the storage circuitry and the buffer circuitry sequentially transfers the X sequential data portions between the storage circuitry and the buffer circuitry. Also, circuitry connected to the storage circuitry directs the storage circuitry to simultaneously transfer N bits between the memory array and the storage circuitry.

In further embodiments of this invention, the semiconductor memory described above is incorporated into an electronic system, such as a computer system, and is fabricated on the surface of a semiconductor substrate, such as a semiconductor wafer.

BRIEF DESCRIPTION OF THE SEVERAL VIEWS OF THE DRAWINGS

In the drawings, which illustrate what is currently regarded as the best mode for carrying out the invention, and in which like reference numerals refer to like parts in different views or embodiments.

DETAILED DESCRIPTION OF THE INVENTION

The terms "bit," "signal," "line," "signal line," "terminal" and "node" are used interchangeably herein and each refers to a physical conductive circuit trace upon which an electrical signal, in the form of a voltage potential, which may vary with time, may be measured. The terms "multiplexer" and "MUX" are used interchangeably herein to indicate an electrical device that connects one of a plurality of data inputs to its output terminal, based on one or more input control signals. Furthermore, each input to, and the output from, a multiplexer may include a plurality of signal lines.

Figure 1:
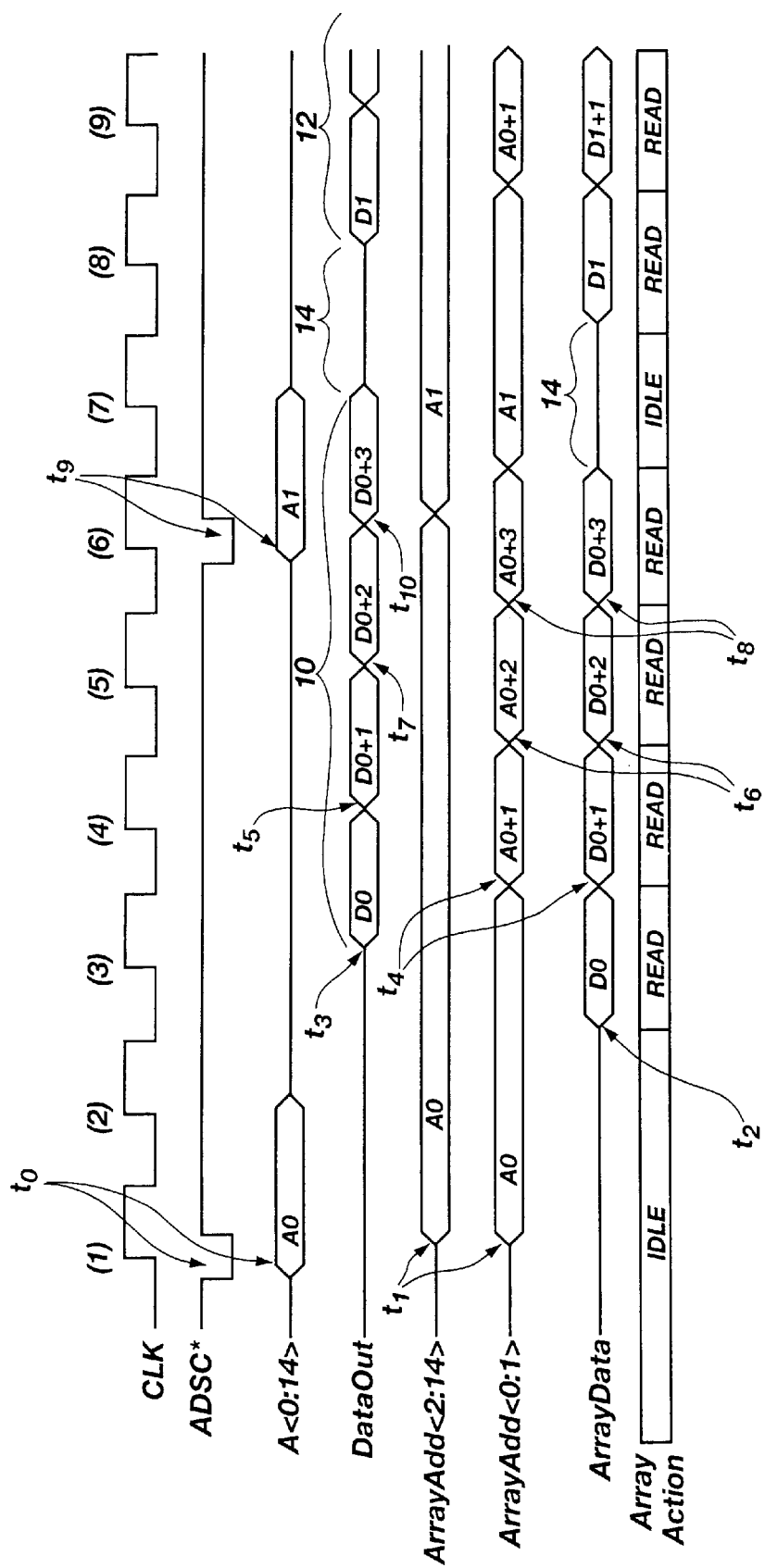
FIG. 1 is a timing diagram illustrating successive reads in a prior art SRAM architecture.
Figure 2:
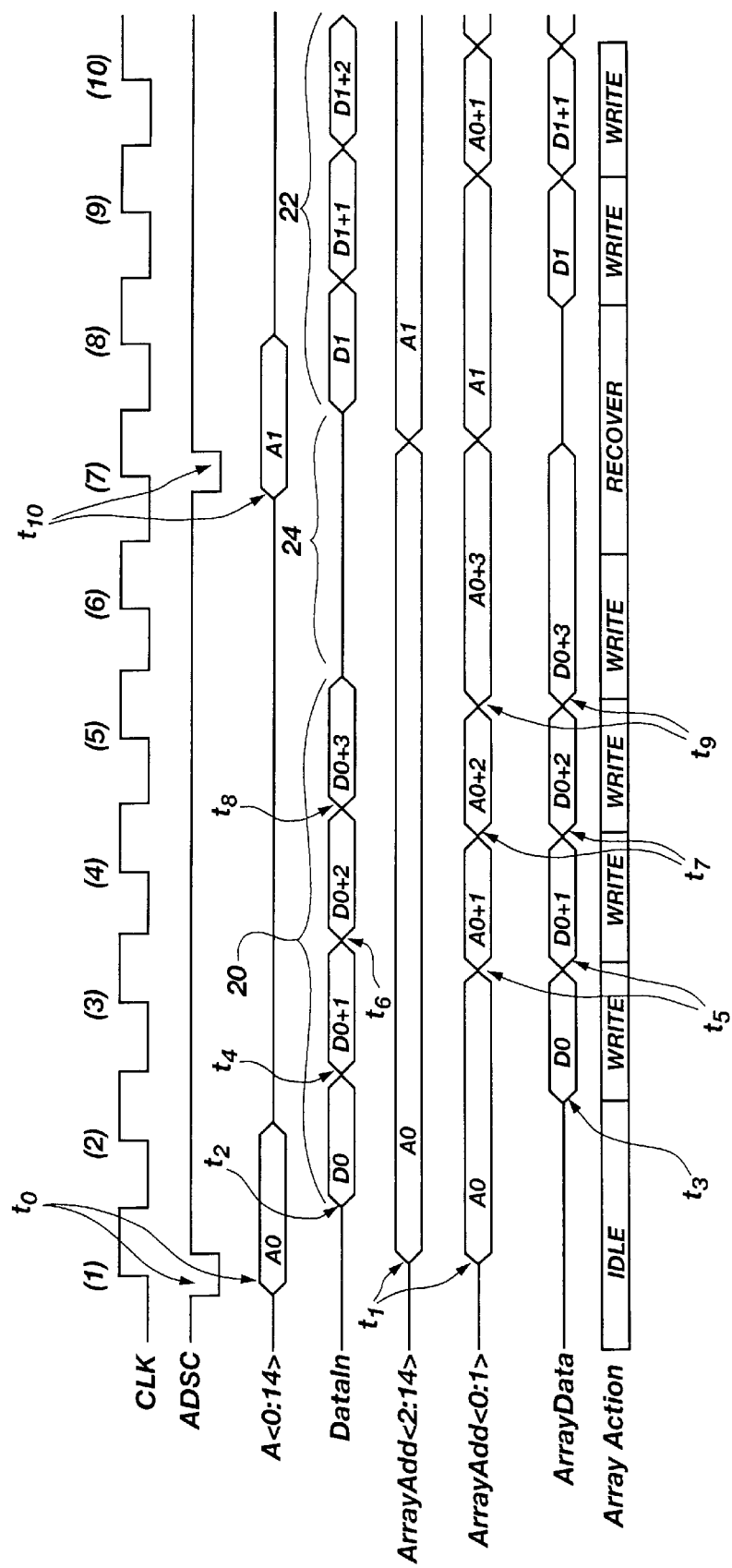
FIG. 2 is a timing diagram illustrating successive writes in a prior art SRAM architecture.
Figure 3:
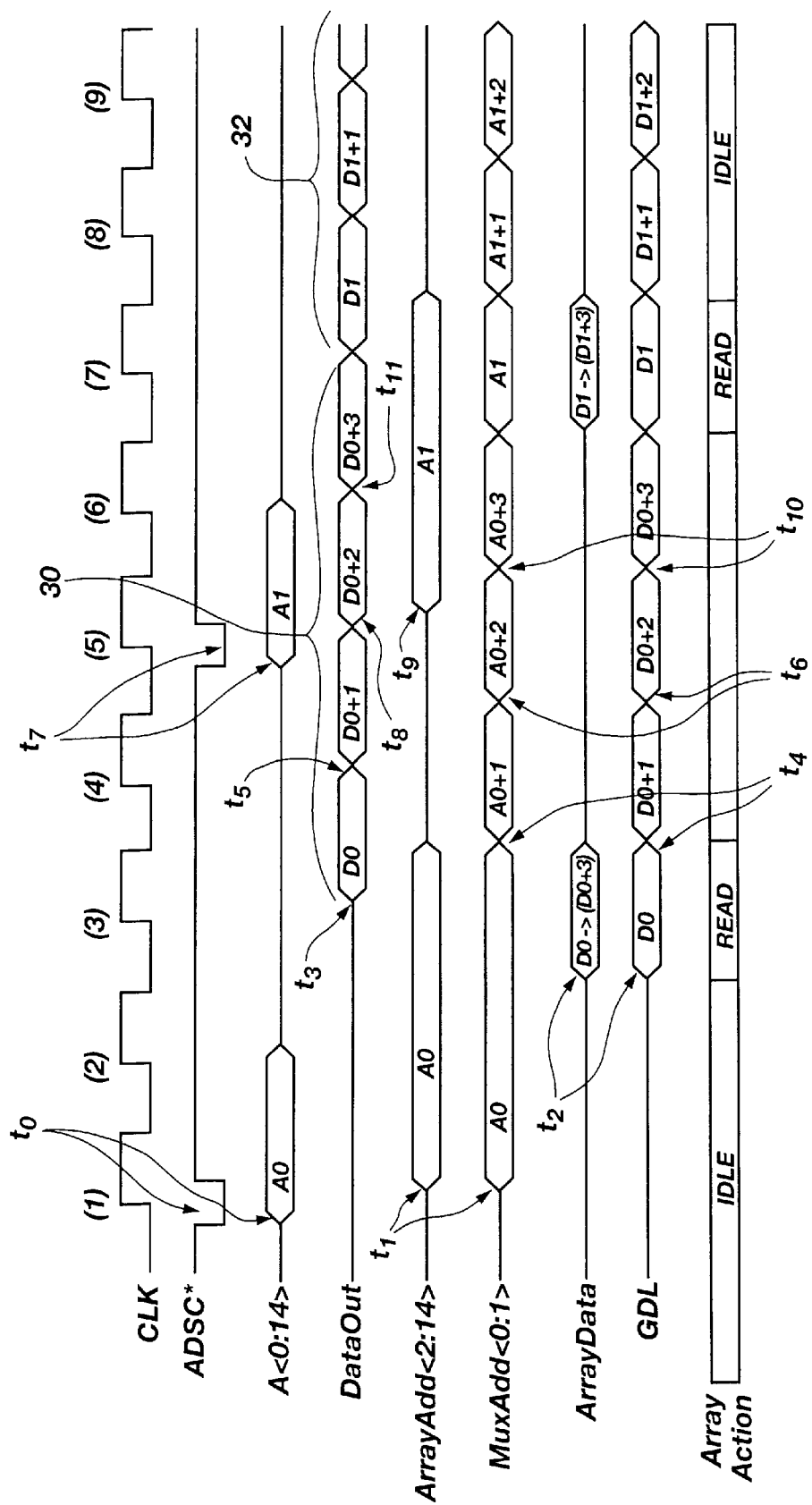
FIG. 3 is a timing diagram illustrating successive reads in an SRAM architecture in accordance with this invention.
Figure 5:
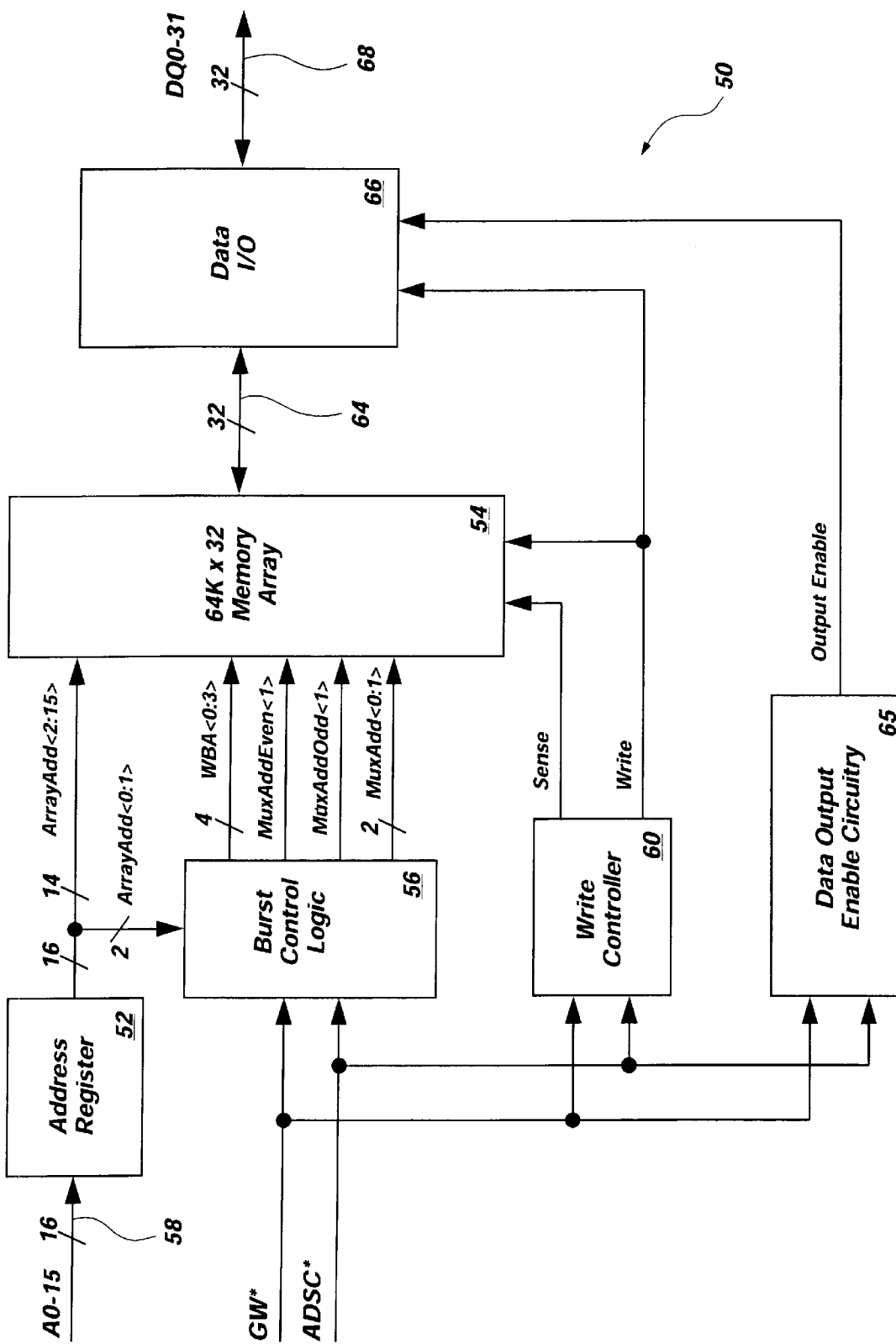
FIG. 5 is a block diagram illustrating an SRAM embodying the SRAM architecture of FIG. 3.

As shown in FIGS. 3 and 5, sequential read operations 30 and 32 in a synchronous SRAM 50 constructed in accordance with an SRAM architecture of this invention occur without interruption by idle cycles, in contrast to the conventional architecture described above. It will be understood by those having skill in the technical field of this invention that the invention is applicable not only to SRAM devices, but also to other semiconductor memory devices.

More specifically, the read operation 30 is initiated at time $t_0$ when the address register signal ADSC* is activated, causing an address register 52 of the SRAM 50 to register the first address A0. The registered address A0 is then presented to a memory array 54 and burst control logic 56 of the SRAM 50 at time $t_1$. Subsequently, at time $t_2$ the memory array 54 senses the data D0 specified by the address A0 simultaneously with the data D0+1, D0+2, and D0+3. At the same time, the array 54 loads the data D0 onto a global data line GDL (described in more detail below with respect to FIG. 6), and at time $t_3$ the SRAM 50 reads out the data D0. At time $t_4$, the array 54 loads the already sensed data D0+1 onto the global data line GDL in accordance with an internally-generated burst address A0+1 presented to the SRAM 50, causing the array 54 to read out the data D0+1 at time $t_5$. Similarly, at time $t_6$, the array 54 loads the already sensed data D0+2 onto the global data line GDL in accordance with an internally-generated burst address A0+2 presented to the array 54, causing the SRAM 50 to read out the data D0+2 at time $t_8$.

Before the array 54 reads out the data D0+2, the read operation 32 is initiated at time $t_7$ when the address register signal ADSC* is again activated, causing the address register 52 to register the second address A1. Subsequently, the registered address A1 is presented to the array 54 and burst control logic 56 at time $t_9$. At time $t_{10}$, the array 54 loads the already sensed data D0+3 onto the global data line GDL in accordance with an internally-generated burst address A0+3 presented to the array 54, causing the array 54 to read out the data D0+3 at time $t_{11}$. The read operation 32 then proceeds in the same manner as the read operation 30.

It should be noted that because the data D0, D0+1, D0+2, and D0+3 are sensed from the array 54 simultaneously at time $t_2$, the array address lines ArrayAdd[2:14] are free at time $t_9$ to present the subsequent address A1. As a result, the array 54 can immediately begin reading out the data D1, etc. after the data D0+3 is read out. This will be explained in more detail below with respect to FIG. 6.

Figure 4:
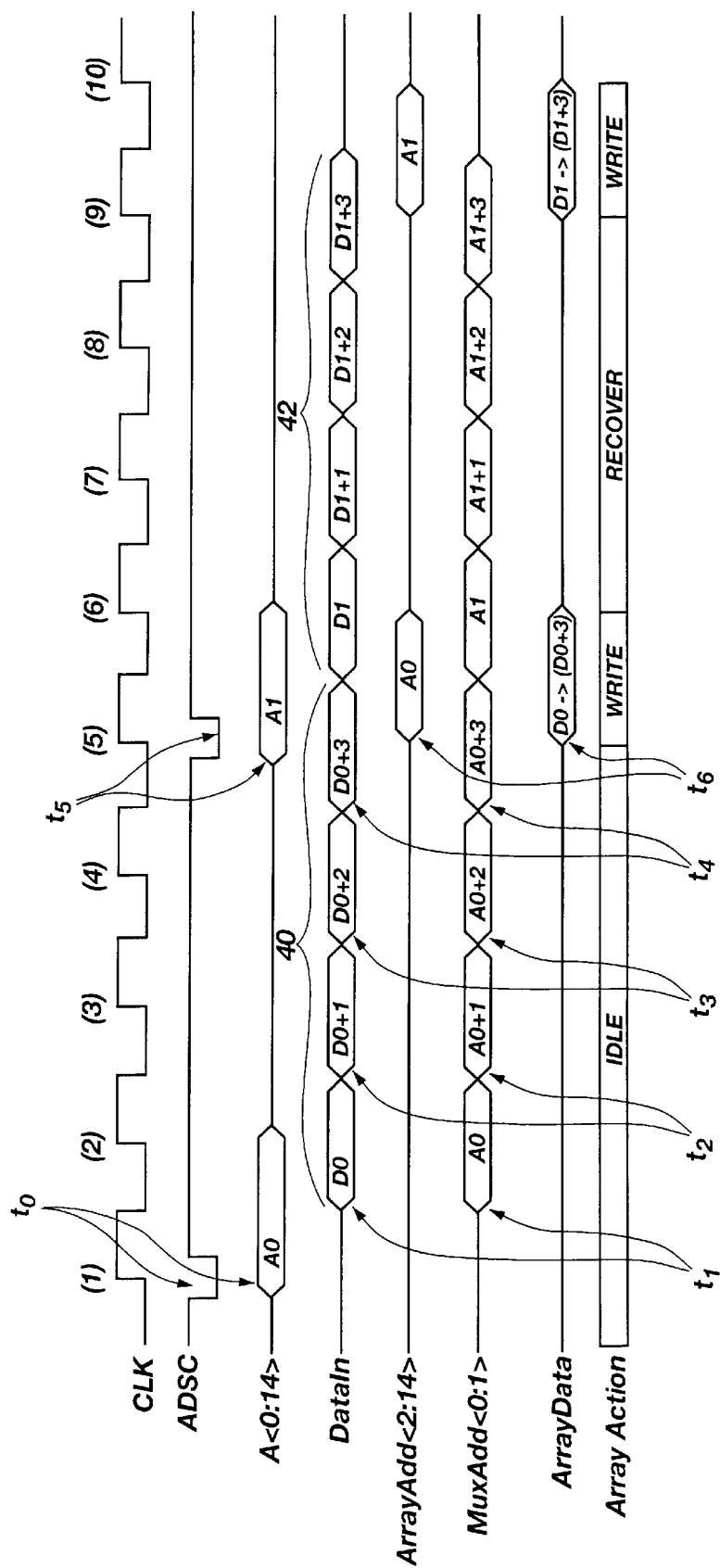
FIG. 4 is a timing diagram illustrating successive writes in the SRAM architecture of FIG. 3.

As shown in FIGS. 4 and 5, sequential write operations 40 and 42 in the synchronous SRAM 50 occur without interruption by idle cycles, in contrast to the conventional architecture described above.

More specifically, the write operation 40 is initiated at time $t_0$ when the address register signal ADSC* is activated, causing the address register 52 of the SRAM 50 to register the first address A0. Next, at times $t_1$, $t_2$, $t_3$, and $t_4$, respectively, the data D0, D0+1, D0+2, and D0+3 is received by the SRAM 50 and latched into the array 54 in accordance with the two least significant bits (referred to as MuxAdd (0:1)) of the registered address A0 and burst-generated addresses A0+1, A0+2, and A0+3, respectively. Using only the two least significant bits of the registered address is by way of example only. It is within the scope of this invention to use two or more of the least significant bits of the registered address. This will be explained in more detail below with respect to FIG. 6.

At time $t_5$, the write operation 42 is initiated when the address register signal ADSC* is activated again, causing the address register 52 of the SRAM 50 to register the second address A1. Then, at time $t_6$, the first address A0 is latched into the array 54, causing the previously latched-in data D0, D0+1, D0+2, and D0+3 to be written into the array 54 simultaneously. The remainder of the write operation 42 then continues in the same manner as the write operation 40.

As shown in FIG. 5, the SRAM 50 includes a 16-bit address bus 58 that provides synchronous addresses (A0-15) to the address register 52. The two least significant bits of the registered synchronous array address, ArrayAdd(0:1), are directed toward the burst control logic 56, while the fourteen most significant bits, ArrayAdd(2:15), are directed toward the memory array 54. The burst control logic 56 takes the two least significant bits of the registered synchronous address, ArrayAdd(0:1), and generates additional signals, MuxAdd(0:1), MuxAddEven(0:1), MuxAddOdd(0:1) and WBA(0:3) for generating two-bit burst addresses during burst read and burst write cycles. The invention is not limited to generating two-bit burst addresses. Using only the two least significant bits of the registered address is by way of example only. It is within the scope of this invention to use two or more of the least significant bits of the registered address.

Write controller 60 generates Sense and Write signals during read and write operations, respectively, for the memory array 54. The write controller 60 also enables input buffers (not shown) within data I/O 66 to place input data on a 32-bit internal I/O data bus 64 in response to a global write signal GW* being active.

When the global write signal GW* is inactive, a read operation takes place, in which case the inactive global write signal GW* causes data output enable circuitry 65 to enable output buffers (not shown) in data I/O 66 for outputting a 32-bit wide data word from the 32-bit external I/O data bus 68 to the 32-bit internal I/O data bus 64.

Figure 6:
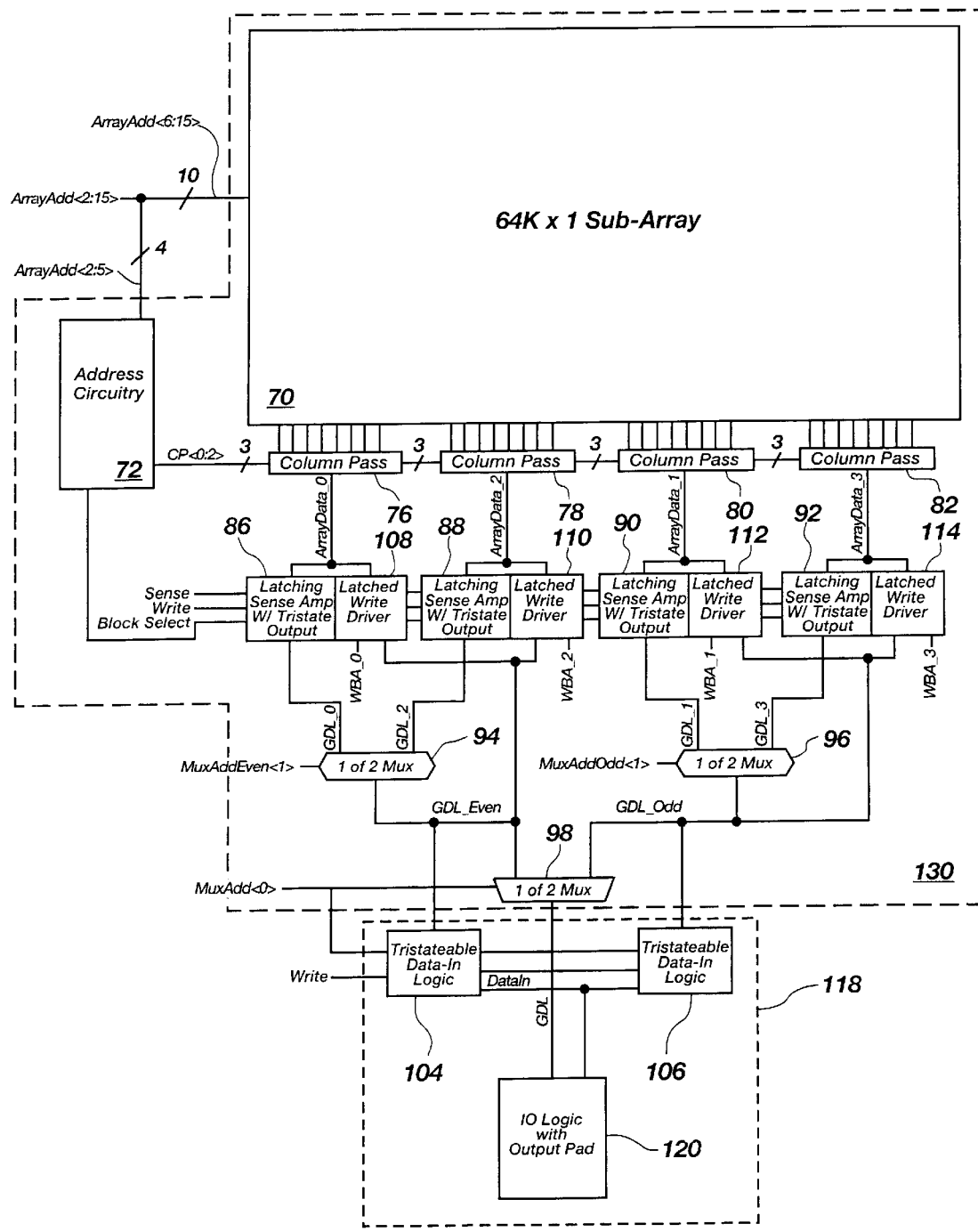
FIG. 6 is a block diagram showing a sub-array of the SRAM of FIG. 5 in more detail.

The memory array 54 includes thirty-two memory sub-array blocks 130, each of size 64K×1. FIG. 6, details a single, memory sub-array block 130 and I/O logic 118. Each memory sub-array block 130 includes a sub-array 70, four column pass circuits 76, 78, 80 and 82, four latching sense amplifiers 86, 88, 90 and 92, four latched write drivers 108, 110, 112 and 114, three 1 of 2 multiplexers 94, 96 and 98, and address circuitry block 72. I/O logic 118 includes an I/O logic with output pad 120 and two tristateable data-in logic blocks 104 and 106. This invention is not limited to the use of latching sense amplifiers. One could replace a latching sense amplifier with a sense amplifier and a register and still be within the scope of the invention.

The memory sub-array block 130 receives array addresses, ArrayAdd(2:15), generated by address register 52 from registered sequential address bits A(2:15). Each memory cell in the sub-array 70 is accessed by a particular row and column in the sub-array 70. The ten most significant registered address bits, ArrayAdd(6:15), from address register 52, form row address bits going directly into sub-array 70. The four other registered address bits go into address circuitry 72. The address circuitry 72 may comprise, for example, pre-decoding logic. The address circuitry 72 generates signals Block Select and CP(0:2). Signals CP(0:2) are all coupled to each column pass circuit 76, 78, 80 and 82. Each column pass circuit 76, 78, 80 and 82 multiplexes 1 of 8 column lines from the sub-array 70 to internal nodes ArrayData_0, ArrayData_2, ArrayData_1 and ArrayData_3, respectively, based on CP(0:2). Node ArrayData_0 is coupled to the input of latching sense amplifier 86 and is also coupled to the output of latched write driver 108. Similarly, ArrayData_2 is coupled to the input of latching sense amplifier 88 and is also coupled to the output of latched write driver 110; ArrayData_1 is coupled to the input of latching sense amplifier 90 and is also coupled to the output of latched write driver 112; and ArrayData_3 is coupled to the input of latching sense amplifier 92 and is also coupled to the output of latched write driver 114.

Signal lines Sense, Write and Block Select are all coupled to the latching sense amplifiers 86, 88, 90 and 92 and to the latched write drivers 108, 110, 112 and 114. Output nodes GDL_0 and GDL_2, from latching sense amplifiers 86 and 88, respectively, are coupled to the inputs of 1 of 2 MUX 94. Similarly, output nodes GDL_1 and GDL_3, of latching sense amplifiers 90 and 92, respectively, are coupled to inputs of 1 of 2 MUX 96. Nodes GDL_Even and GDL_Odd, are coupled to the output terminals of multiplexers 94 and 96, respectively, and the inputs of 1 of 2 MUX 98. Nodes GDL_Even and GDL_Odd, are also coupled to outputs of tristateable data-in logic 104 and 106. The output, GDL, of 1 of 2 MUX 96 is coupled to the input of I/O logic with output pad 120. An output of I/O logic with output pad 120 is coupled to node DataIn, which is also coupled to inputs on tristateable data-in logic 104 and 106.

Referring to FIG. 5, burst control logic 56 receives the two least significant registered address bits ArrayAdd(0:1) registered by address register 52. The burst control logic 56 latches in the registered address bits, ArrayAdd(0:1), generates look ahead addresses even when the address register 52 (FIG. 5) is receiving and registering the next address (e.g., A1) in sequence. As a result, the memory array 54 can continue working in accordance with a previous address (e.g., A0) while the next address in sequence (e.g., A1) is being registered.

A read operation will now be described in detail with reference to FIG. 5 and a single sub-array 70, FIG. 6, of which there are thirty-two such sub-arrays 70 on the exemplary memory device die. In a read operation, the latched-in array address, ArrayAdd(2:15) causes the sub-array 70 to output all thirty-two bits of a row selected in accordance with the array address, ArrayAdd(2:15), to column pass circuits 76, 78, 80 and 82. Each column pass circuit 76, 78, 80 and 82 passes one of the eight input data bits to nodes ArrayData_0, ArrayData_2, ArrayData_1 and ArrayData_3, respectively, in accordance with control signals CP(0:2). All four data bits are latched in latching sense amplifiers 86, 88, 90 and 92, in response to an active Sense signal from the write controller 60 (FIG. 5). Simultaneously, of course, thirty-one other sub-arrays (not shown) each latch four data bits in analogous latching sense amplifiers.

Once latched into the sense amplifiers 86, 88, 90, and 92, the four latched bits are sequentially selected and output from the sense amplifiers 86, 88, 90, and 92, through multiplexers 94, 96, and 98, and onto one of thirty-two global data lines, GDL, in accordance with signals MuxAdd (0), MuxAddEven(1), and MuxAddOdd(1) generated by the burst control logic 56 (FIG. 5), as discussed above. All thirty-two of the global data lines, GDL, (only one of which is shown in FIG. 6) are then sent to an I/O logic with output pad 12 and placed on the 32-bit wide I/O data bus 68 as DQ0-31 (FIG. 5) in accordance with a Output Enable signal generated by data output enable circuitry 65 (FIG. 5).

In a write operation, 32-bit wide data words, DQ0-31, are sequentially received by data I/O 66 from I/O data bus 68 and presented on DataIn nodes, one of which is shown in FIG. 6, and passed to tristateable data-in logic blocks 104 and 106 in accordance with MuxAdd(0). Tristateable data-in logic blocks 104 and 106 then output the received data bit on node GDL_Even to inputs of write drivers 108 and 110, and node GDL_Odd to inputs of write drivers 112 and 114. At the same time, burst control logic 56 (FIG. 5) generates write burst address bits, WBA(0:3), which controls which of the write drivers 108, 110, 112, and 114 latch in the data bit in each cycle. Once all of the write drivers 108, 110, 112, and 114 have latched in a bit, a Write signal from the write controller 60 (FIG. 5) causes all the write drivers 108, 110, 112, and 114 to simultaneously write their respective latched bits into the row of the sub-array 70 specified by ArrayAdd (2:15).

Of course, it will be understood that the present invention is applicable to memory arrays of any type and size and, specifically, is not limited to 64K×32 arrays and 64K×1 sub-arrays. It will also be understood that this invention may easily be extended to memory arrays that incorporate a parity bit, e.g., 64K×36.

Figure 7:
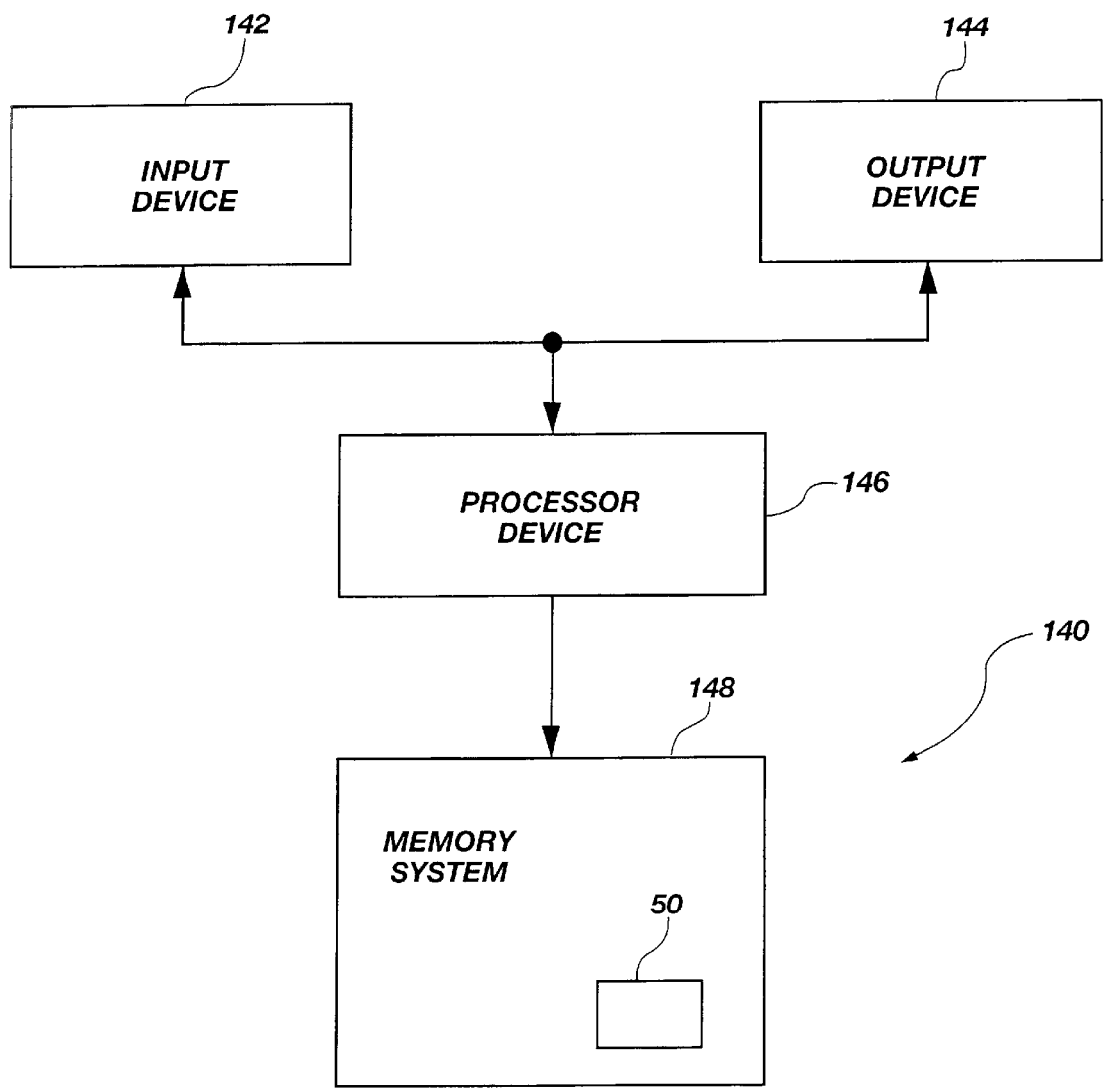
FIG. 7 is a block diagram showing an electronic system incorporating the SRAM of FIG. 5.

As shown in FIG. 7, an electronic system 140 includes an input device 142, an output device 144, a processor device 146, and a memory system 148 that incorporates the SRAM 50 of FIG. 5. It will be understood that the SRAM 50 may be incorporated into one of the input, output, and processor devices 142, 144, and 146 instead of the memory system 148.

Figure 8:
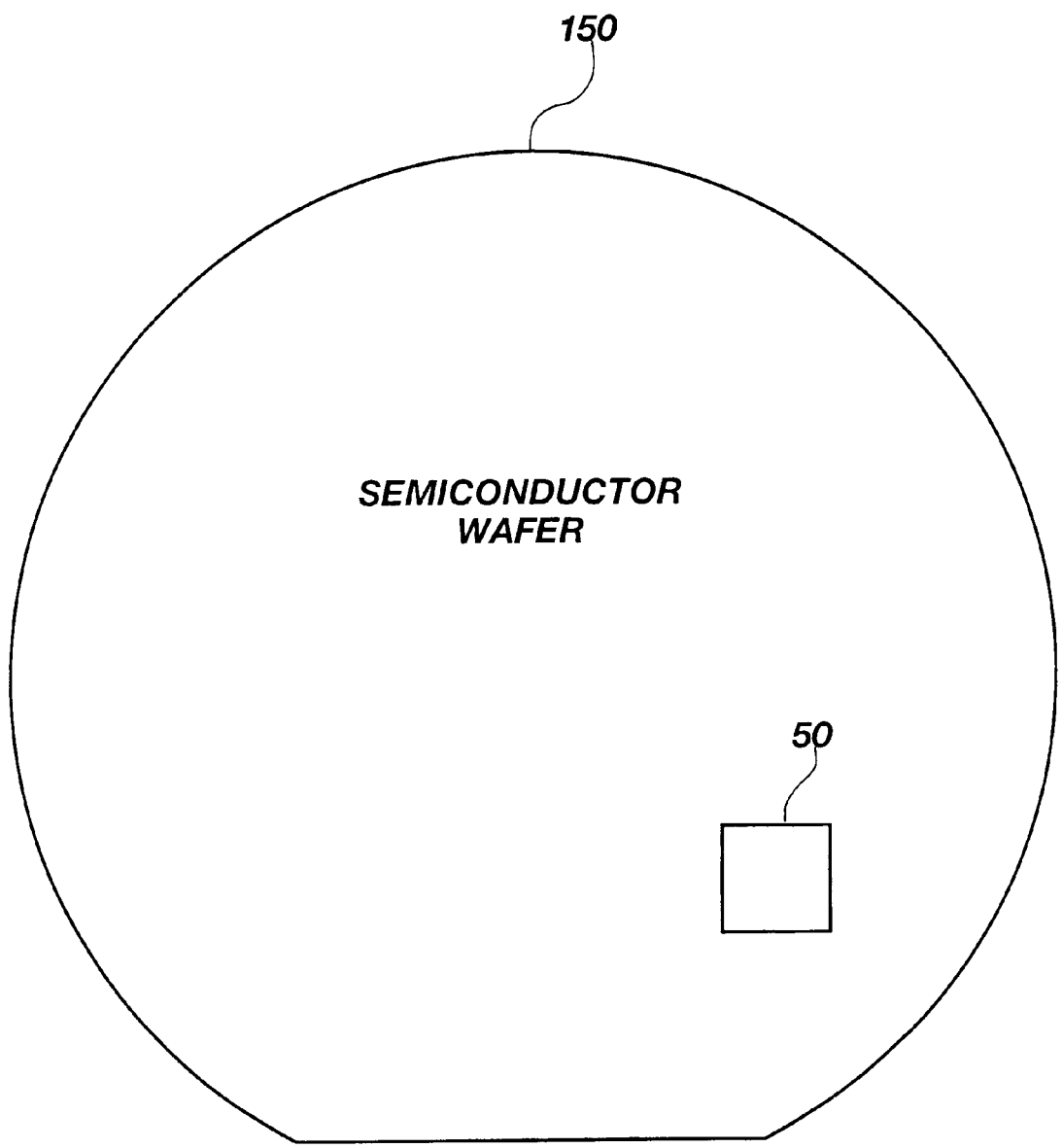
FIG. 8 is a diagram illustrating a semiconductor wafer having the SRAM of FIG. 5 fabricated on its surface.

As shown in FIG. 8, the SRAM 50 of FIG. 5 is fabricated on the surface of a semiconductor wafer 150 in accordance with this invention. Of course, it should be understood that the SRAM 50 may be fabricated on semiconductor substrates other than a silicon wafer, such as a silicon-on-insulator (SOI) substrate, a silicon-on-glass (SOG) substrate, and a silicon-on-sapphire (SOS) substrate. Semiconductor materials other than silicon, such as gallium arsenide and indium phosphide may also be employed to fabricate SRAM 50.

Although this invention has been described with reference to particular embodiments, the invention is not limited to these described embodiments. For example, this invention is not limited to the use of latching sense amplifiers. One could replace a latching sense amplifier with a sense amplifier and a register and still be within the scope of the invention. This invention is limited only by the appended claims, which include within their scope all equivalent devices or methods that operate according to the principles of the invention as described.

What is claimed is:

1. A method for retrieving a plurality of sequentially stored data bits, comprising:

latching an address of a first one of said plurality of sequentially stored data bits;

simultaneously addressing a plurality of storage elements having said plurality of sequentially stored data bits stored therein;

simultaneously sensing and latching said plurality of sequentially stored data bits from said plurality of storage elements;

outputting said first one of said plurality of sequentially stored data bits;

generating burst addresses for at least a portion of others of said plurality of sequentially stored data bits; and for each of said burst addresses, outputting others of said plurality of sequentially stored data bits.

2. A method for retrieving a plurality of data bits, comprising:

selecting a row of addressable data storage elements from an external address;

simultaneously sensing and temporarily latching said plurality of data bits stored in said row;

according to said external address, outputting a portion of said temporarily latched plurality of data bits;

generating one or more internal burst addresses from said external address; and for each of said one or more internal burst addresses, outputting another portion of said temporarily latched plurality of data bits in accordance with said each of said one or more internal burst addresses.

3. The method of claim 2, wherein said addressable data storage elements have a burst length of X, and wherein said outputting a portion of said temporarily latched plurality of data bits comprises selecting an equal number of said plurality of data bits for each of said outputting steps and further where X comprises a nonzero positive integer.

4. The method of claim 2, wherein said addressable data storage elements have a burst length of X, where X comprises a nonzero positive integer, and wherein the act of generating one or more internal burst addresses comprises generating X-1 internal burst addresses.

5. A method for storing a plurality of data bits, comprising:

receiving an externally supplied address corresponding to a storage location for a first portion of said plurality of data bits of sequential portions;

generating one or more internal burst addresses from said externally supplied address;

for said externally supplied address and for each internal burst address generated, temporarily storing one of said sequential portions of said plurality of data bits; and simultaneously writing said temporarily stored one of said sequential portions of said plurality of data bits into a row of addressable data storage elements identified by said externally supplied address.

6. The method of claim 5, wherein said addressable data storage elements have a burst length of X, where X comprises a nonzero positive integer, and wherein receiving said plurality of data bits comprises receiving said plurality of data bits in sequential portions having an equal number of said plurality of data bits.

7. The method of claim 5, wherein said addressable data storage elements have a burst length of X, where X comprises a nonzero positive integer, and wherein temporarily storing one of said sequential portions of said plurality of data bits comprises temporarily storing one of said sequential portions of said plurality of data bits in latched write drivers.

8. A memory storage circuit for burst transfer of a plurality of sequential data portions, comprising:

a memory array configured to store a plurality of sequential data portions;

storage circuitry coupled to said memory array configured for temporarily storing said plurality of sequential data portions;

buffer circuitry for buffering said plurality of sequential data portions;

multiplexing circuitry coupled between said storage circuitry and said buffer circuitry for sequentially transferring said plurality of sequential data portions between said storage circuitry and said buffer circuitry; and circuitry coupled to said storage circuitry for directing said storage circuitry to simultaneously transfer said plurality of sequential data portions of said memory array and said storage circuitry.

9. The memory storage circuit, as recited in claim 8, wherein said memory array comprises a sub-array.

10. The memory storage circuit, as recited in claim 8, wherein said storage circuitry comprises latched sense amplifiers and latched write drivers.

11. The memory storage circuit, as recited in claim 8, wherein said buffer circuitry comprises at least one of input buffer circuitry and output buffer circuitry.

* * * * *